(12) United States Patent
Wang et al.

(10) Patent No.: US 9,773,887 B2
(45) Date of Patent: Sep. 26, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Ying-Chiao Wang, Changhua County (TW); Chao-Hung Lin, Changhua County (TW); Ssu-I Fu, Kaohsiung (TW); Jyh-Shyang Jenq, Pingtung County (TW); Li-Wei Feng, Kaohsiung (TW); Yu-Hsiang Hung, Tainan (TW)

(73) Assignee: UNITED MICORELECTRONICS CORP., Hsin-Chu (TW)

( * ) Notice: Subject to any disclaimer, the term of this patent is extended or adjusted under 35 U.S.C. 154(b) by 4 days.

(21) Appl. No.: 14/957,623

(22) Filed: Dec. 3, 2015

(65) Prior Publication Data
US 2017/0133479 A1 May 11, 2017

(30) Foreign Application Priority Data

Nov. 6, 2015 (CN) .......................... 2015 1 0749346

(51) Int. Cl.
*H01L 29/66* (2006.01)
*H01L 21/033* (2006.01)
*H01L 21/3105* (2006.01)
*H01L 21/311* (2006.01)
*H01L 21/32* (2006.01)
*H01L 29/78* (2006.01)

(52) U.S. Cl.
CPC ...... *H01L 29/6656* (2013.01); *H01L 21/0332* (2013.01); *H01L 21/31053* (2013.01); *H01L 21/31144* (2013.01); *H01L 21/32* (2013.01); *H01L 29/78* (2013.01)

(58) Field of Classification Search
CPC .......... H01L 21/0332; H01L 21/31144; H01L 21/32; H01L 21/31053; H01L 29/78; H01L 29/6656
See application file for complete search history.

(56) References Cited

U.S. PATENT DOCUMENTS

| 8,389,371 | B2 | 3/2013 | Wang | |
| 8,765,546 | B1* | 7/2014 | Hung | .............. H01L 21/823431 257/190 |
| 8,921,947 | B1* | 12/2014 | Hung | .................... H01L 29/458 257/202 |
| 2005/0040479 | A1 | 2/2005 | Koldiaev et al. | |
| 2008/0179684 | A1* | 7/2008 | Liang | .............. H01L 21/823807 257/369 |

(Continued)

OTHER PUBLICATIONS

Chia-Lin Lu et al., Title: Semiconductor Device and Method for Fabricating the Same, pending U.S. Appl. No. 14/963,216, filed Dec. 8, 2015.

*Primary Examiner* — Christine Enad
(74) *Attorney, Agent, or Firm* — Winston Hsu

(57) ABSTRACT

A method for fabricating semiconductor device is disclosed. The method includes the steps of: providing a substrate having a gate structure thereon, a first spacer around the gate structure, and a contact etch stop layer (CESL) adjacent to the first spacer; forming a cap layer on the gate structure, the first spacer, and the CESL; and removing part of the cap layer for forming a second spacer adjacent to the CESL.

16 Claims, 6 Drawing Sheets

(56) References Cited

U.S. PATENT DOCUMENTS

| | | | |
|---|---|---|---|
| 2010/0052074 A1* | 3/2010 | Lin | H01L 21/823807 257/407 |
| 2012/0068234 A1 | 3/2012 | Soss et al. | |
| 2012/0098043 A1* | 4/2012 | Hsieh | H01L 21/823842 257/288 |
| 2012/0309158 A1* | 12/2012 | Hung | H01L 21/324 438/301 |
| 2013/0228871 A1* | 9/2013 | Huang | H01L 29/66545 257/368 |

* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of forming spacer adjacent to contact etch stop layer (CESL).

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, particularly during the stage when part of the metal gate is removed and a protective hard mask is formed on the metal gate, the design of current protective hard mask is no longer effective in protecting metal gate from damages. Hence, how to resolve this issue has become an important task in this field.

SUMMARY OF THE INVENTION

According to a preferred embodiment of the present invention, a method for fabricating semiconductor device is disclosed. The method includes the steps of: providing a substrate having a gate structure thereon, a first spacer around the gate structure, and a contact etch stop layer (CESL) adjacent to the first spacer; forming a cap layer on the gate structure, the first spacer, and the CESL; and removing part of the cap layer for forming a second spacer adjacent to the CESL.

According to another aspect of the present invention, a semiconductor device is disclosed. The semiconductor device includes: a substrate having a gate structure thereon; a first spacer around the gate structure; a CESL adjacent to the first spacer; and a second spacer adjacent to the CESL.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
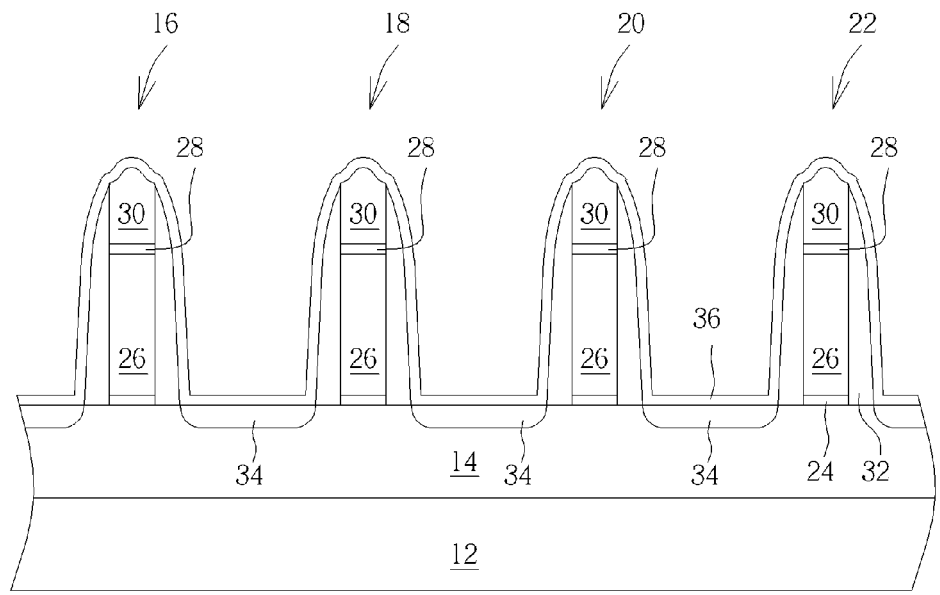
FIGS. 1-11 illustrate a method for fabricating semiconductor device according to a preferred embodiment of the present invention.

Referring to FIGS. 1-11, FIGS. 1-11 illustrate a method for fabricating semiconductor device according to a preferred embodiment of the present invention. As shown in FIG. 1, a substrate 12, such as a silicon substrate or silicon-on-insulator (SOI) substrate is provided, and a transistor region, such as a PMOS region or a NMOS region is defined on the substrate 12. At least a fin-shaped structure 14 and an insulating layer (not shown) are formed on the substrate 12, in which the bottom of the fin-shapes structure 14 is preferably enclosed by the insulating layer, such as silicon oxide to form a shallow trench isolation (STI), and a plurality of gate structures 16, 18, 20, 22 are formed on part of the fin-shaped structure 14. It should be noted that even though four gate structures 16, 18, 20, are disclosed in this embodiment, the quantity of the gate structures is not limited to four, but could by any quantity depending on the demand of the product.

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form a STI surrounding the bottom of the fin-shaped structure 14. Alternatively, the formation of the fin-shaped structure 14 could be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. Similarly, the patterned hard mask could be removed selectively or retained, and deposition, CMP, and then etching back could be used to form a STI surrounding the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the STI could be eliminated.

The fabrication of the gate structures 16, 18, 20, 22 could be accomplished by a gate first process, a high-k first approach from gate last process, or a high-k last approach from gate last process. Since this embodiment pertains to a high-k first approach, gate structures 16, 18, 20, 22 containing high-k dielectric layer 24, gate electrodes 26 composed of polysilicon material, first hard mask 28, and second hard mask 30 could be first formed on the fin-shaped structure 14, and spacers 32 are formed adjacent to the gate structures 16, 18, 20, 22.

In this embodiment, the high-k dielectric layer 24 is preferably selected from dielectric materials having dielectric constant (k value) larger than 4. For instance, the high-k dielectric layer 24 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Preferably, the first hard masks 28 and second hard masks 30 are composed of different material. For instance, the first hard masks 28 could include silicon nitride and the second hard masks 30 could include silicon oxide, but not limited thereto. The spacers 32 could be selected from the group consisting of silicon dioxide, silicon nitride, silicon oxynitride (SiON), and silicon carbon nitride (SiCN), but not limited thereto.

Next, source/drain regions 34 and/or epitaxial layers (not shown) are formed in the fin-shaped structure 14 and/or substrate 12 adjacent to two sides of the spacers 32, and silicides (not shown) are selectively formed on the surface of the source/drain regions 34 and/or epitaxial layers. A contact etch stop layer (CESL) 36 is then formed on the gate structures 16, 18, 20, 22 and the substrate 12, in which the CESL 36 could be selected from the group consisting of silicon nitride and SiCN, but not limited thereto.

Figure 2:
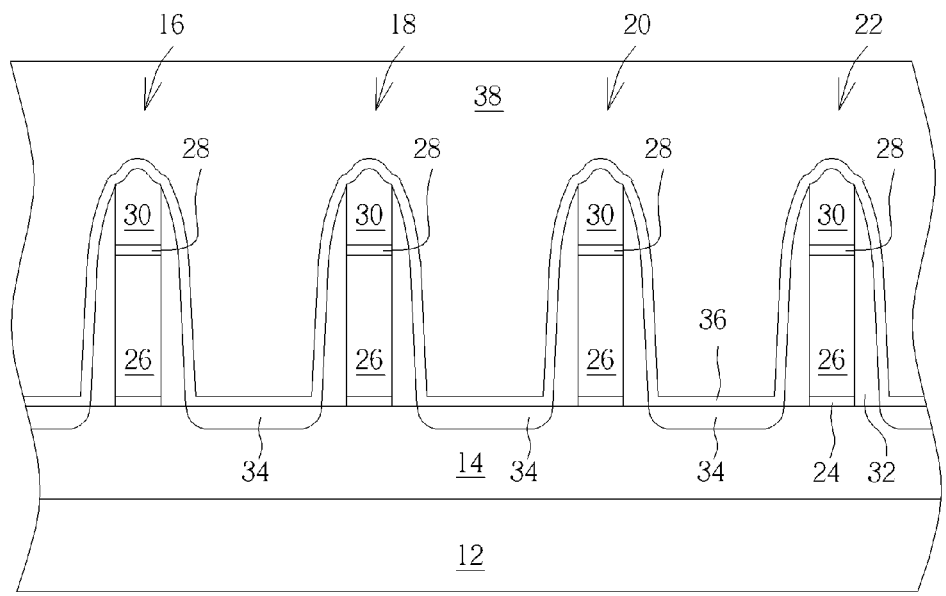

Next, as shown in FIG. 2, a mask layer 38 is formed on the gate structures 16, 18, 20, 22 and the CESL 36 and filling the space between gate structures 16, 18, 20, 22. In this embodiment, the mask layer could include an organic dielectric layer (ODL) and/or a photoresist, but not limited thereto.

Figure 3:
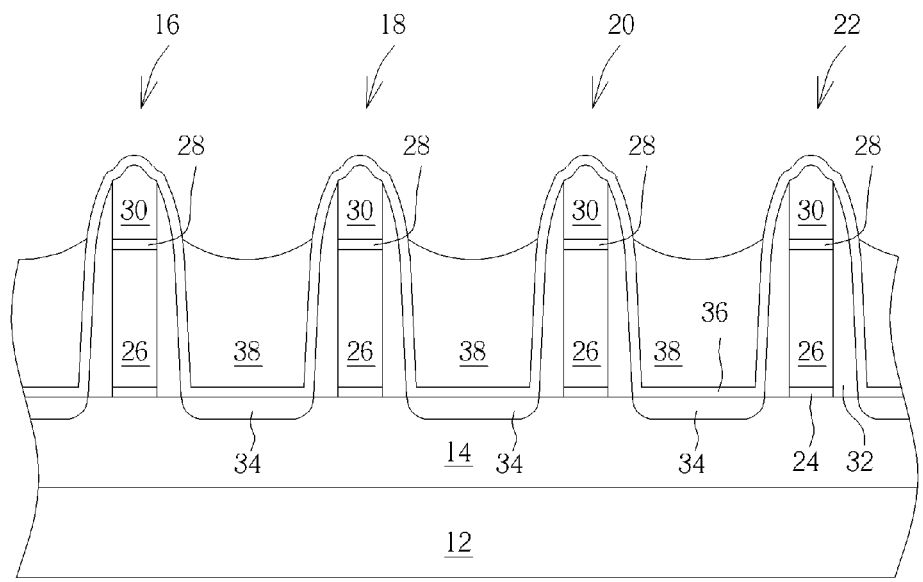

Next, as shown in FIG. 3, an etching process is conducted to remove part of the mask layer 38 so that the top surface of the remaining mask layer 38 is slightly lower than the top surface of the second hard masks 30.

Figure 4:
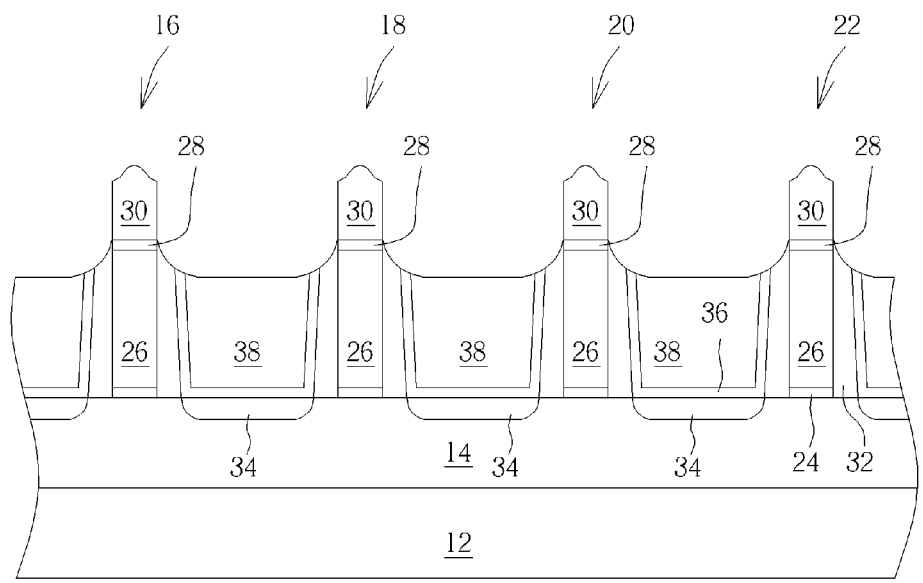

Next, as shown in FIG. 4, another etching process is conducted to remove part of the CESL 36 and part of the spacers 32 adjacent to the second hard masks 30 and expose the second hard masks 30, in particular exposing the top surface and sidewalls of the second hard masks 30. It should be noted that in this step, only part of the spacers 32 is removed so that the remaining spacers 32 are still disposed adjacent to the first hard mask 28 and gate electrodes 26 and the top surfaces of the remaining spacers 32 preferably include curved surfaces or substantially arc profiles.

Figure 5:
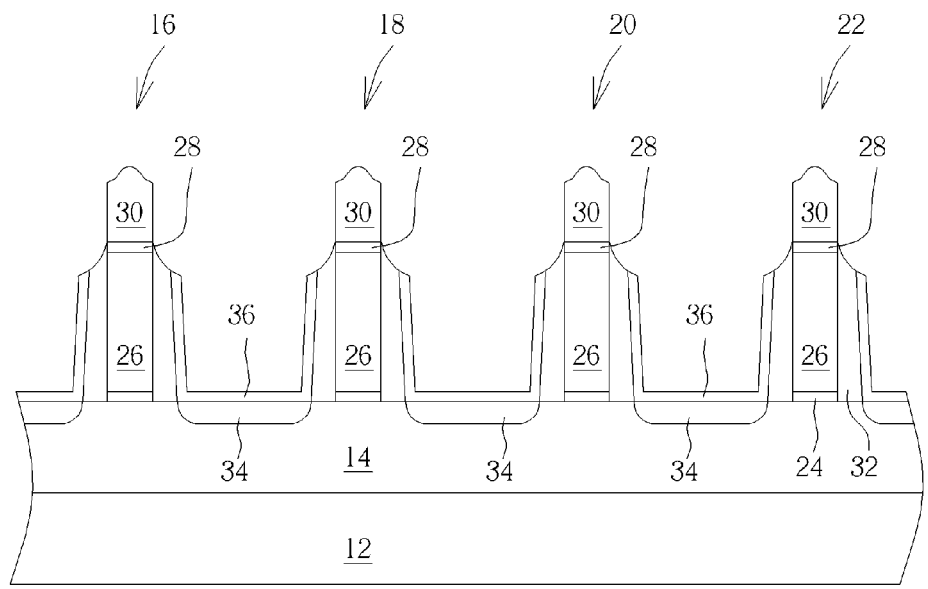

Next, as shown in FIG. 5, the mask layer 38 is removed completely to expose the CESL 36 underneath.

Figure 6:
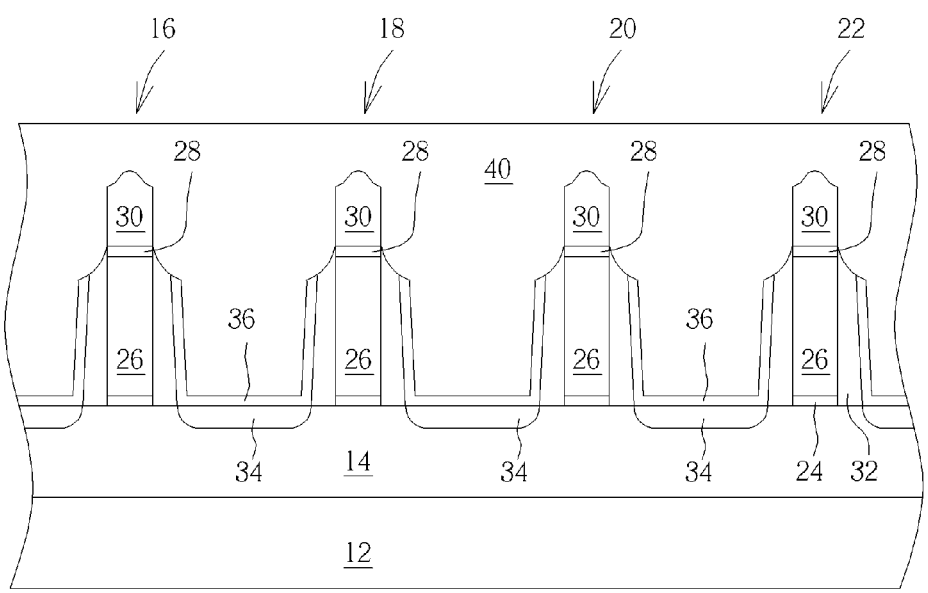

Next, as shown in FIG. 6, a first interlayer dielectric (ILD) layer 40 is formed on the gate structures 16, 18, 20, 22 to cover the CESL 36, spacers 32, and second hard masks 30 completely. In this embodiment, the first ILD layer 40 could be selected from the material consisting of silicon oxide, silicon nitride, SiON, and SiCN, but not limited thereto.

Figure 7:
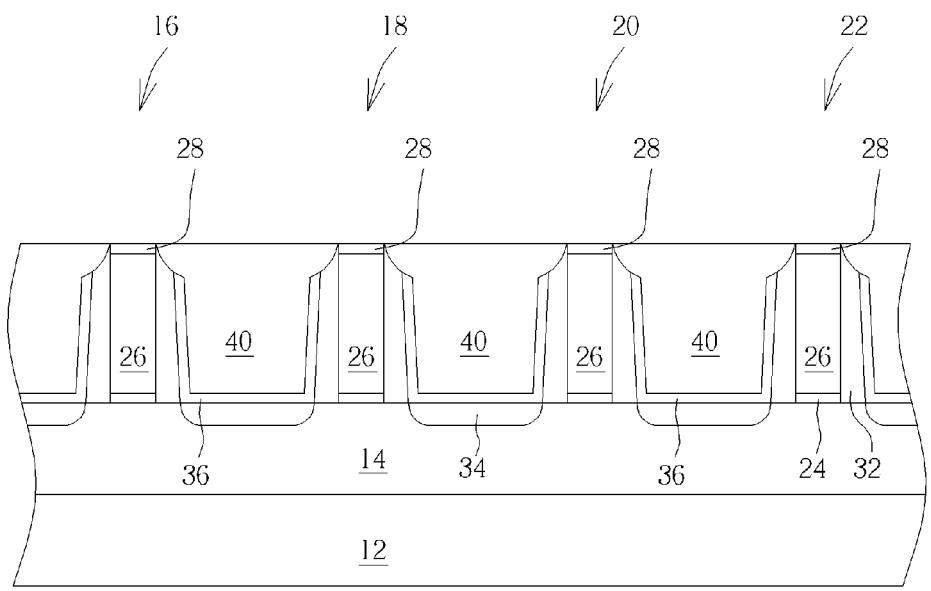

Next, as shown in FIG. 7, a planarizing process, such as a chemical mechanical polishing (CMP) process is conducted to planarize part of the first ILD layer 40 and remove all of the second hard masks 30 and even part of the first hard masks 28 so that the top surface of the remaining first hard masks 28 and the top surface of the first ILD layer 40 are coplanar.

Figure 8:
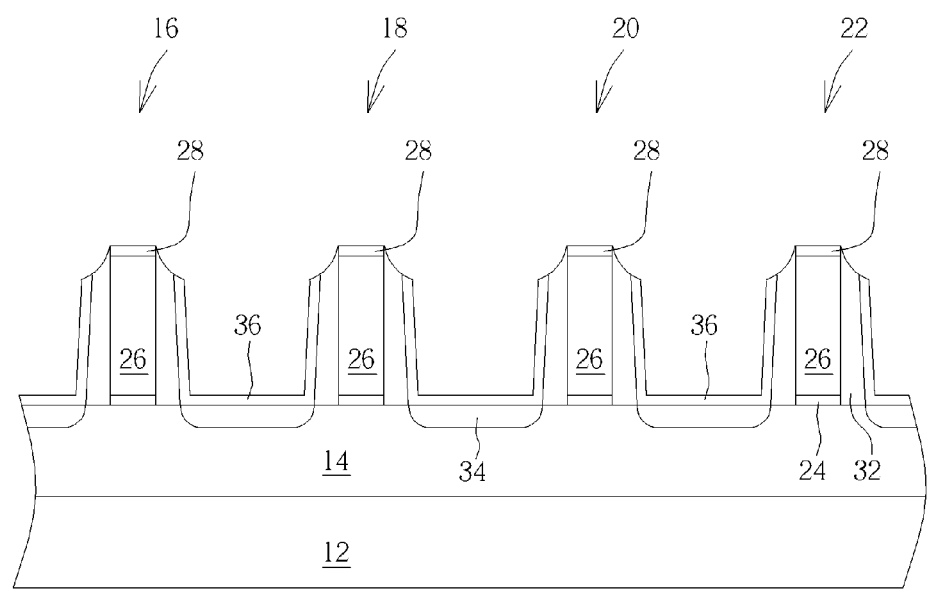

Next, as shown in FIG. 8, an etching process is conducted to remove the first ILD layer 40 completely and expose the CESL 36 underneath once more.

Figure 9:
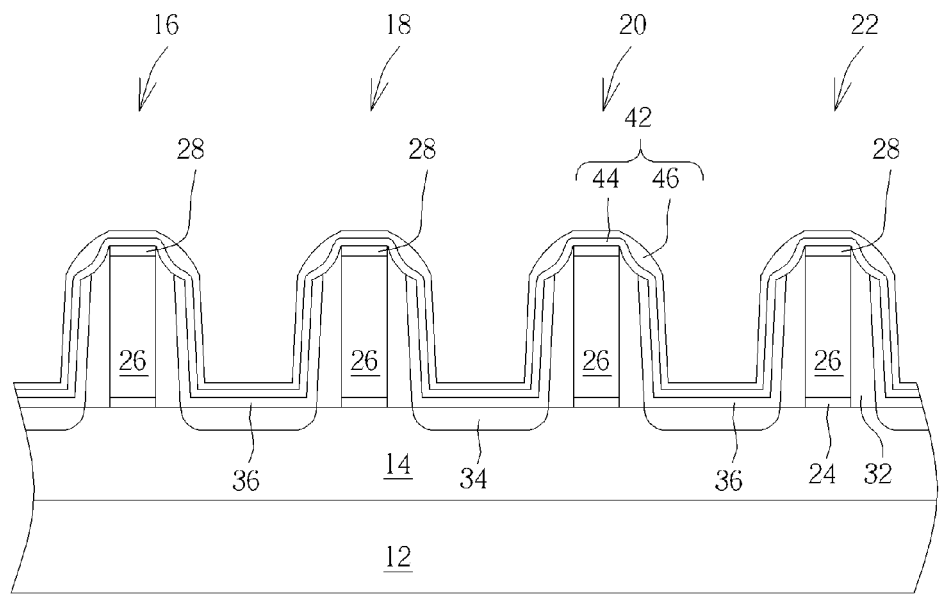

Next, as shown in FIG. 9, a cap layer 42 is formed on the gate structures 16, 18, 20, 22, spacers 32, first hard masks 28, and CESL 36, in which the cap layer 42 is preferably a composite structure further including a cap layer 44 and a cap layer 46. In this embodiment, the cap layer 44 and cap layer 46 are preferably composed of different material. For instance, the cap layer 44 could include silicon oxide and cap layer 46 could include SiCN, but not limited thereto. According to an embodiment of the present invention, the cap layers 44 and 46 could be selected from the group consisting of silicon oxide, SiCN, SiCON, and SiCBN while the two layers 44 and 46 are composed of different material, which is also within the scope of the present invention.

Figure 10:
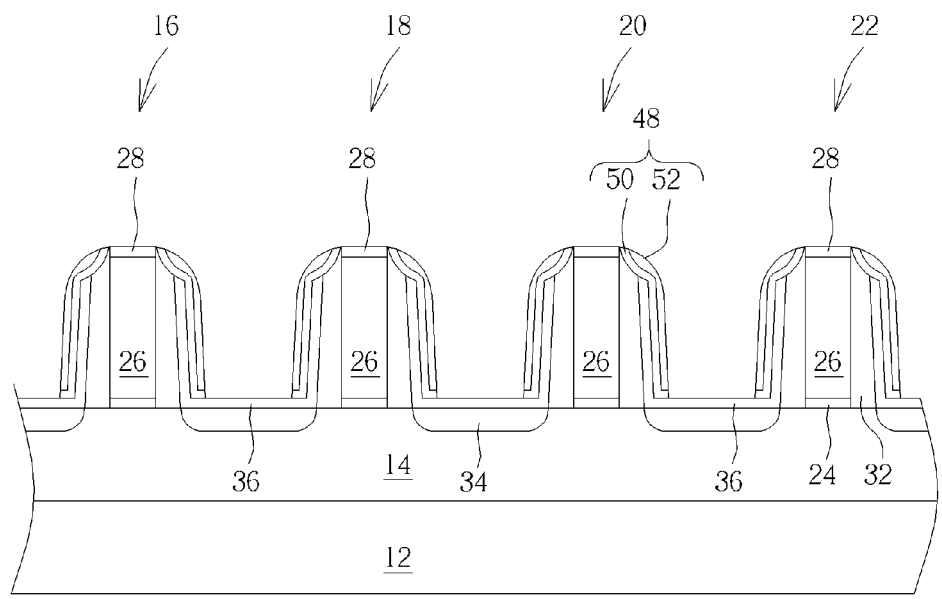

Next, as shown in FIG. 10, an etching process is conducted to remove part of the cap layer 42 for forming spacers 48 adjacent to the CESL 36, in which each of the spacers 48 further includes a spacer 50 sitting on the CESL 36 and a spacer 52 disposed on the spacer 50.

Figure 11:
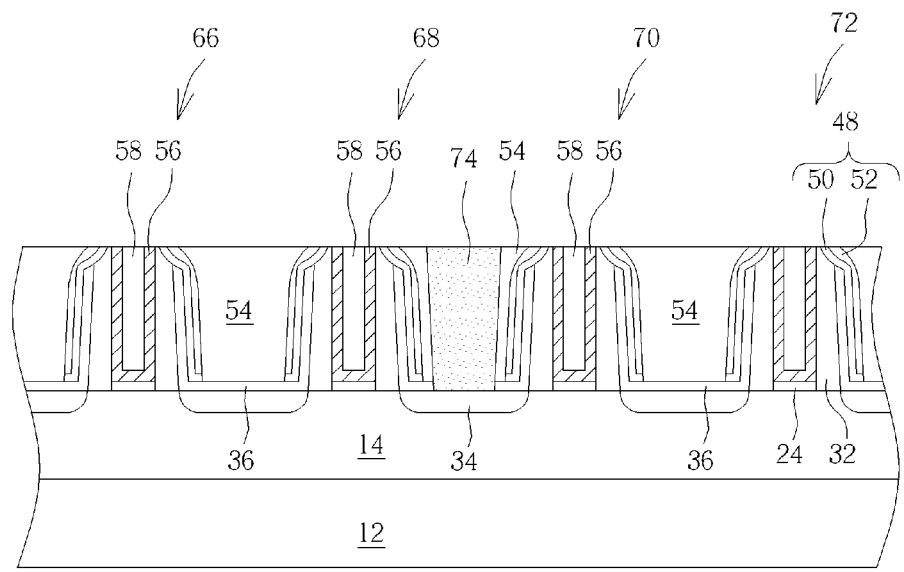

Next, as shown in FIG. 11, a second ILD layer 54 is formed on the gate structures 16, 18, 20, 22, CESL 36, and spacers 48, and a planarizing process, such as CMP is conducted to remove part of the second ILD layer 54, part of the spacer 32, part of the CESL 36, and part of the spacers 48 so that the top surfaces of the remaining ILD layer 54, spacers 32, CESL 36, and spacers 48 are coplanar.

Next, a replacement metal gate (RMG) process is conducted by first using an etching process to remove the gate electrodes 26 composed of polysilicon material for forming recesses (not shown), sequentially depositing a work function metal layer 56 and a low resistance metal layer 58 into the recesses, using a planarizing process such as CMP to remove part of the low resistance metal layer 58 and part of the work function metal layer 56 for forming metal gates 66, 68, 70, 72.

In this embodiment, the work function metal layer 56 is formed for tuning the work function of the later formed metal gates to be appropriate in an NMOS or a PMOS. For an NMOS transistor, the work function metal layer 56 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 56 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 56 and the low resistance metal layer 58, in which the material of the barrier layer may include titanium (Ti), titanium nitride (TiN), tantalum (Ta) or tantalum nitride (TaN). Furthermore, the material of the low-resistance metal layer 58 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Next, a contact plug formation process could be conducted by using etching process to remove part of or all of the second ILD layer 54 between metal gates 68 and 70 and part of the CESL 36 for forming contact hole (not shown), and then depositing metals into the contact hole to form contact plug 74 electrically connected to the source/drain region 34 in the fin-shaped structure 14. In this embodiment, the contact plug 74 could include a barrier layer and a metal layer, in which the barrier layer is selected from the group consisting of Ti, Ta, TiN, TaN, and WN, and the metal layer is selected from the group consisting of Al, Ti, Ta, W, Nb, Mo, and Cu, but not limited thereto. This completes the fabrication of a semiconductor device according to a preferred embodiment of the present invention.

Referring again to FIG. 11, which further illustrates a structural view of a semiconductor device according to a preferred embodiment of the present invention. As shown in FIG. 11, the semiconductor device includes a substrate 12, at least a gate structure or metal gate 66 disposed on the substrate 12, a spacer 32 around the metal gate 66, a CESL 36 adjacent to the spacer 32, and another spacer 48 disposed adjacent to the CESL 36.

Specifically, the CESL 36 in this embodiment is L-shaped, the spacer 48 further includes a spacer 50 and spacer 52, the spacer 50 is L-shaped and sitting on the CESL 36, the spacer 52 is disposed on the spacer 50, and edges of the spacers 50 and 52 are not aligned with an edge of the CESL 36. In this embodiment, the CESL 36 is preferably composed of silicon nitride or SiCN, the spacer 32 is composed of silicon oxide or silicon nitride, the spacer 50 is composed of silicon oxide, and the spacer 52 is composed SiCN, but not limited thereto. For instance, the spacers 50 and 52 could be selected from the group consisting of silicon oxide, SiCN, SiCON, and SiCBN while the spacers 50 and 52 are composed of different material.

Figure 12:
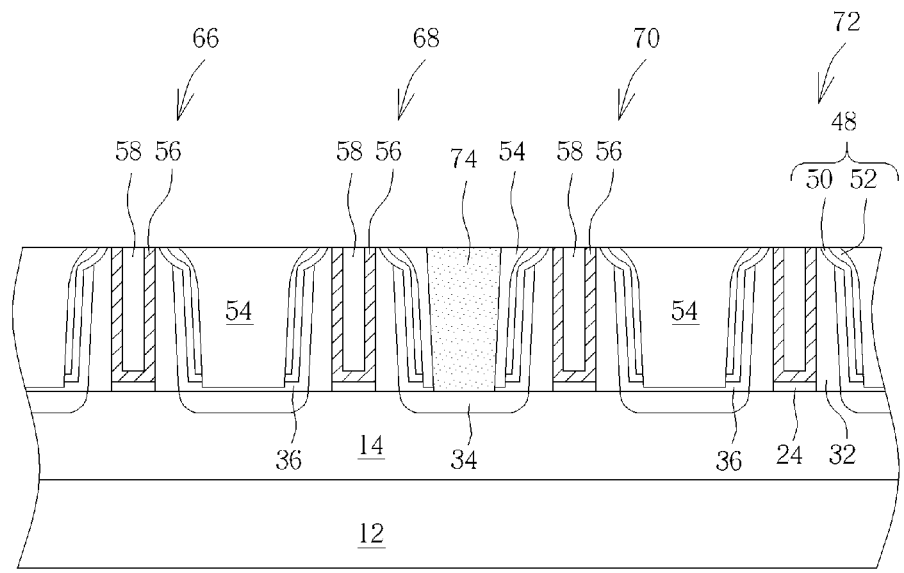
FIG. 12 illustrates a structural view of a semiconductor device according to an embodiment of the present invention.

Referring to FIG. 12, which illustrates a structural view of a semiconductor device according to an embodiment of the present invention. As shown in FIG. 12, in contrast to using etching process to remove part of the cap layer 42 to form spacers 48 without removing or losing any CESL 36 under the spacer 48 as shown in FIG. 10, it would be desirable to remove part of the CESL 36 while removing part of the cap layer 42 to form spacers 48 so that an edge of the spacers 48 is aligned with an edge of the CESL 36, which is also within the scope of the present invention.

Overall, the present invention first forms the CESL and deposits a cap layer on the gate structure, spacer, and CESL, and then removes part of the cap layer to form another spacer adjacent to the CESL. Through the protection of this spacer, it would be desirable to use the spacer to define the position of contact hole in the later self-aligned contact formation process thereby providing an optimized choice for the etching process conducted afterwards.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a gate structure thereon and the gate structure comprising a first hard mask and a second hard mask on a gate electrode, a first spacer around the gate structure, and a contact etch stop layer (CESL) adjacent to the first spacer;
    forming the CESL on the substrate, the first spacer, and the second hard mask;
    forming a mask layer on the CESL;
    removing part of the mask layer so that the top surface of the mask layer is lower than the bottom surface of the second hard mask;
    removing part of the CESL and part of the first spacer to expose the second hard mask;
    removing the mask layer;
    forming a first interlayer dielectric (ILD) layer on the gate structure, the CESL, and the second hard mask after the top surface of the CESL is lower than the top surface of the gate electrode and the top surface of the first spacer;
    planarizing part of the first ILD layer and the second hard mask;
    removing the first ILD layer;
    forming a cap layer on the gate structure, the first spacer, the first hard mask, and the CESL; and
    removing part of the cap layer for forming a second spacer adjacent to the CESL.

2. The method of claim 1, further comprising:
    forming a second ILD layer on the gate structure, the CESL and the second spacer; and
    planarizing part of the second ILD layer, part of the second spacer, part of the CESL, and part of the first spacer.

3. The method of claim 1, further comprising removing part of the cap layer and part of the CESL for forming the second spacer.

4. A semiconductor device, comprising:
    a substrate having a gate structure thereon, wherein the gate structure comprises a first hard mask on a gate electrode;
    a first spacer around the gate structure;
    a CESL adjacent to the first spacer, wherein a top surface of the CESL is lower than a top surface of the gate electrode and a top surface of the first spacer; and
    a second spacer adjacent to the CESL, wherein the second spacer contacts the CESL and the first spacer directly, a corner edge of the second spacer is aligned with an edge of the CESL located under the second spacer and a material of the second spacer is selected from the group consisting of silicon oxide, SiCN, SiCON, and SiCBN.

5. The semiconductor device of claim 4, wherein the CESL is L-shaped.

6. The semiconductor device of claim 5, wherein the second spacer comprises:
    a third spacer on the CESL, wherein the third spacer is L-shaped; and
    a fourth spacer on the third spacer.

7. The semiconductor device of claim 6, further comprising an interlayer dielectric (ILD) layer on the fourth spacer.

8. The semiconductor device of claim 7, wherein the top surfaces of the third spacer, the fourth spacer, and the ILD layer are coplanar.

9. The semiconductor device of claim 7, wherein the top surfaces of the first spacer, the third spacer, the fourth spacer, and the ILD layer are coplanar.

10. The semiconductor device of claim 7, wherein the ILD layer contacts the third spacer, the fourth spacer, and the CESL directly.

11. The semiconductor device of claim 6, wherein an edge of the third spacer is aligned with an edge of the CESL.

12. The semiconductor device of claim 6, wherein a bottom surface of the third spacer contacts the CESL directly.

13. The semiconductor device of claim 6, wherein the third spacer contacts the first spacer and the CESL directly.

14. The semiconductor device of claim 4, wherein an edge of the second spacer is not aligned with an edge of the CESL.

15. The semiconductor device of claim 4, wherein the CESL comprises a first step-shaped profile under the second spacer.

16. A semiconductor device, comprising:
    a substrate having a gate structure thereon, wherein the gate structure comprises a first hard mask on a gate electrode;
    a first spacer around the gate structure;
    a CESL adjacent to the first spacer, wherein a top surface of the CESL is lower than a top surface of the gate electrode and a top surface of the first spacer;
    a second spacer adjacent to the CESL, wherein the second spacer comprises a third spacer on the CESL and a fourth spacer on the third spacer; and
    an interlayer dielectric (ILD) layer on the fourth spacer, wherein the top surfaces of the ILD layer and the gate electrode are coplanar and the ILD layer contacts the third spacer, the fourth spacer, and the CESL directly.

* * * * *

UNITED STATES PATENT AND TRADEMARK OFFICE
CERTIFICATE OF CORRECTION

PATENT NO. : 9,773,887 B2
APPLICATION NO. : 14/957623
DATED : September 26, 2017
INVENTOR(S) : Ying-Chiao Wang et al.

It is certified that error appears in the above-identified patent and that said Letters Patent is hereby corrected as shown below:

On the Title Page

Item (73), correct the name of the assignee from "UNITED MICORELECTRONICS CORP." to --UNITED MICROELECTRONICS CORP.--.

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*